(12) United States Patent
Fan et al.

(10) Patent No.: US 7,473,121 B2
(45) Date of Patent: Jan. 6, 2009

(54) ELECTRICAL CONNECTOR ASSEMBLY HAVING CONNECTING PORTION

(75) Inventors: Chia-Wei Fan, Tu-cheng (TW); Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/151,537

(22) Filed: May 7, 2008

(65) Prior Publication Data

US 2008/0280474 A1 Nov. 13, 2008

(30) Foreign Application Priority Data

May 7, 2007 (TW) .............................. 96207258 U

(51) Int. Cl.
*H01R 13/625* (2006.01)
(52) U.S. Cl. ...................... 439/342; 439/331
(58) Field of Classification Search .................. 439/73, 439/342, 331, 92, 266
See application file for complete search history.

(56) References Cited

U.S. PATENT DOCUMENTS

| 6,547,580 | B1 | 4/2003 | Leavitt et al. |
| 6,752,636 | B2* | 6/2004 | Ma .............................. 439/73 |
| 6,881,088 | B2* | 4/2005 | Gattuso et al. .............. 439/342 |
| 7,070,436 | B2* | 7/2006 | Chin .......................... 439/342 |

* cited by examiner

*Primary Examiner*—Briggitte R Hammond
(74) *Attorney, Agent, or Firm*—Wei Te Chung

(57) ABSTRACT

An electrical connector assembly (100) is provided for connecting a heat sink thereto and has a housing (3), a number of contacts mounted into the housing, a stiffener (2), a clip (4) covering the housing and a lever (5). The stiffener includes a top plate (21) defining a number of mounting holes (252) thereon and a window (212) defined in a centre of the top plate. The electrical connector assembly further has a number of connecting portions (6) interfering with the inner surface of the mounting holes for connecting the heat sink to the stiffener.

12 Claims, 3 Drawing Sheets

ELECTRICAL CONNECTOR ASSEMBLY HAVING CONNECTING PORTION

BACKGROUND OF THE INVENTION

1. Field of the Invention

The present invention is directed to an electrical connector assembly, and particularly to an electrical connector assembly having a connecting portion for mounting a heat sink thereto.

2. Description of Prior Arts

U.S. Pat. No. 6,547,580 issued on Apr. 15, 2003 discloses an electrical connector assembly for electrically connecting a Land Grid Package (LGP) to a printed circuit board (PCB). The electrical connector assembly includes a base, a number of terminals secured on the base, a cover pivotably mounted to one end of the base, a pair of locking mechanisms having a central aperture defined in a central portion thereof. The cover serves as an integrally formed heat sink to conduct heat away from the LGP. The cover is locked by a pair of locking portions which protrude from opposite ends of the base. The locking mechanism is pivotably mounted to one end of the cover for locking the cover in the closed position.

However, it is complicated to assembly the heat sink to the base of the electrical connector assembly.

Hence, it is desirable to provide an improved electrical connector to overcome the aforementioned disadvantages.

SUMMARY OF THE INVENTION

An object of the present invention is to provide an electrical connector assembly having a plurality of connecting portions for mounting a heat sink thereto.

To achieve the above object, an electrical connector assembly is provided for connecting a heat sink thereto and mounting to a printed circuit board. The electrical connector comprises a housing assembled to the printed circuit board, a plurality of contacts mounted into the housing, a stiffener punched by a metal sheet and having a top plate and a window defined in a centre of the top plate for receiving the housing, a clip covering the housing and pivotably engaging with one top plate and a lever coupling with the stiffener for pressing the clip. The top plate defines a plurality of mounting holes thereon. The electrical connector assembly further has a plurality of connecting portions interfering with the inner surface of the mounting holes for connecting the heat sink to the stiffener.

Advantages of the present invention are to provide a stiffener defining a plurality of mounting holes for receiving a number of connecting portions for directly connecting the heat sink to the electrical connector assembly. It would result in simplifying the assembly of the heat sink to the stiffener of the electrical connector assembly.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
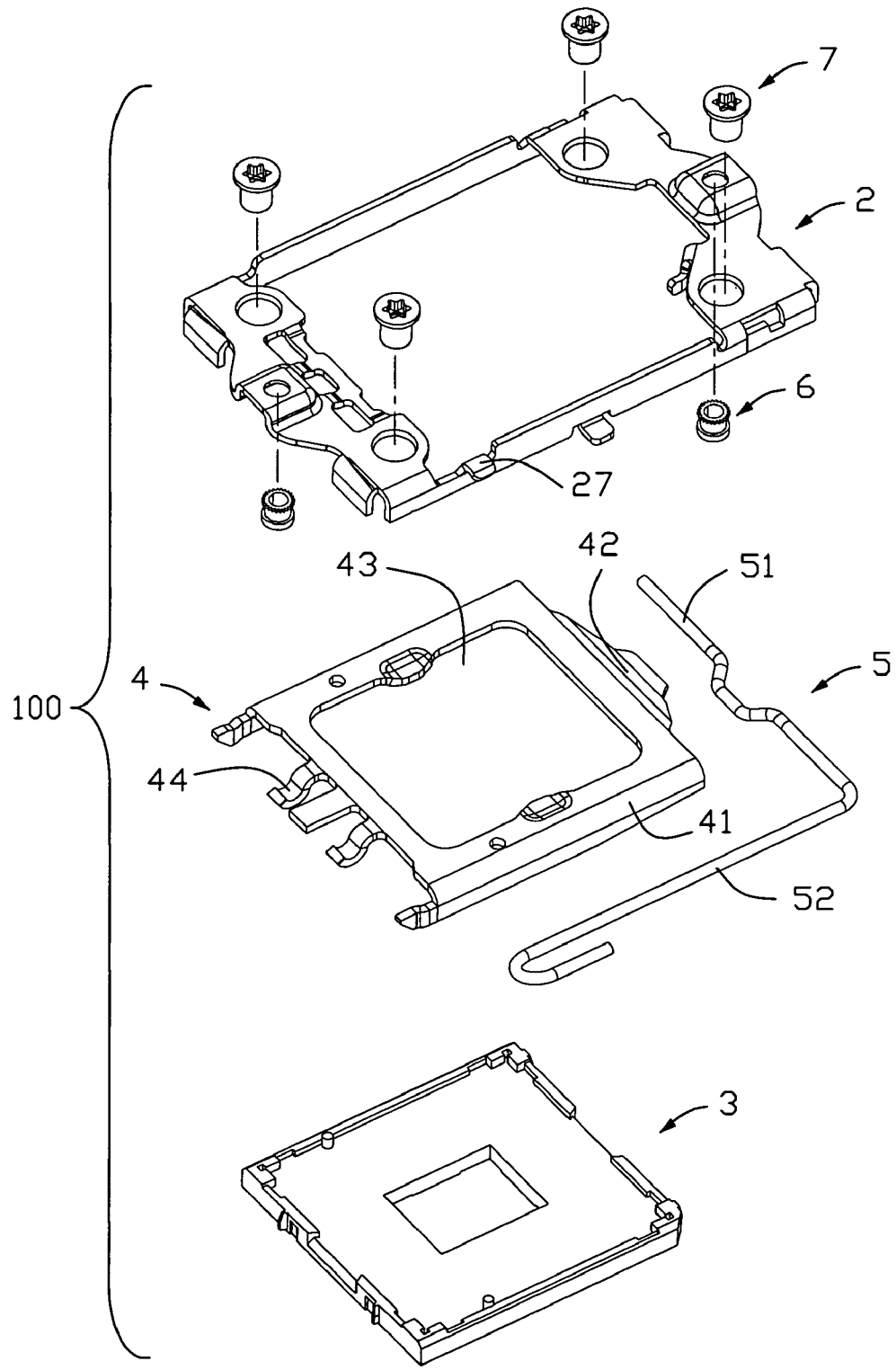
FIG. 1 is an exploded view of an electrical connector assembly of the present invention.

Reference will now be made to the drawing figures to describe the present invention in detail. Referring to FIGS. 1-4, an electrical connector assembly 100 assembled a heat sink (not shown) thereto and mounting to a printed circuit board 1, comprises a housing 3 mounted on the printed circuit board 1, a stiffener 2 engaging with the housing 3, a clip 4 pivotably engaged on one end of the stiffener 2, a plurality of connecting portions 6 connecting the heat sink to the printed circuit board 1 and a lever 5 engaged on another end of the stiffener 2 for fastening the clip 4 onto the housing 3.

Referring to FIG. 1, the housing 3 is of rectangular configuration. A plurality of passageways (not labeled) are defined in the housing 3 for receiving a number of corresponding electrical contacts (not shown) therein.

Figure 2:
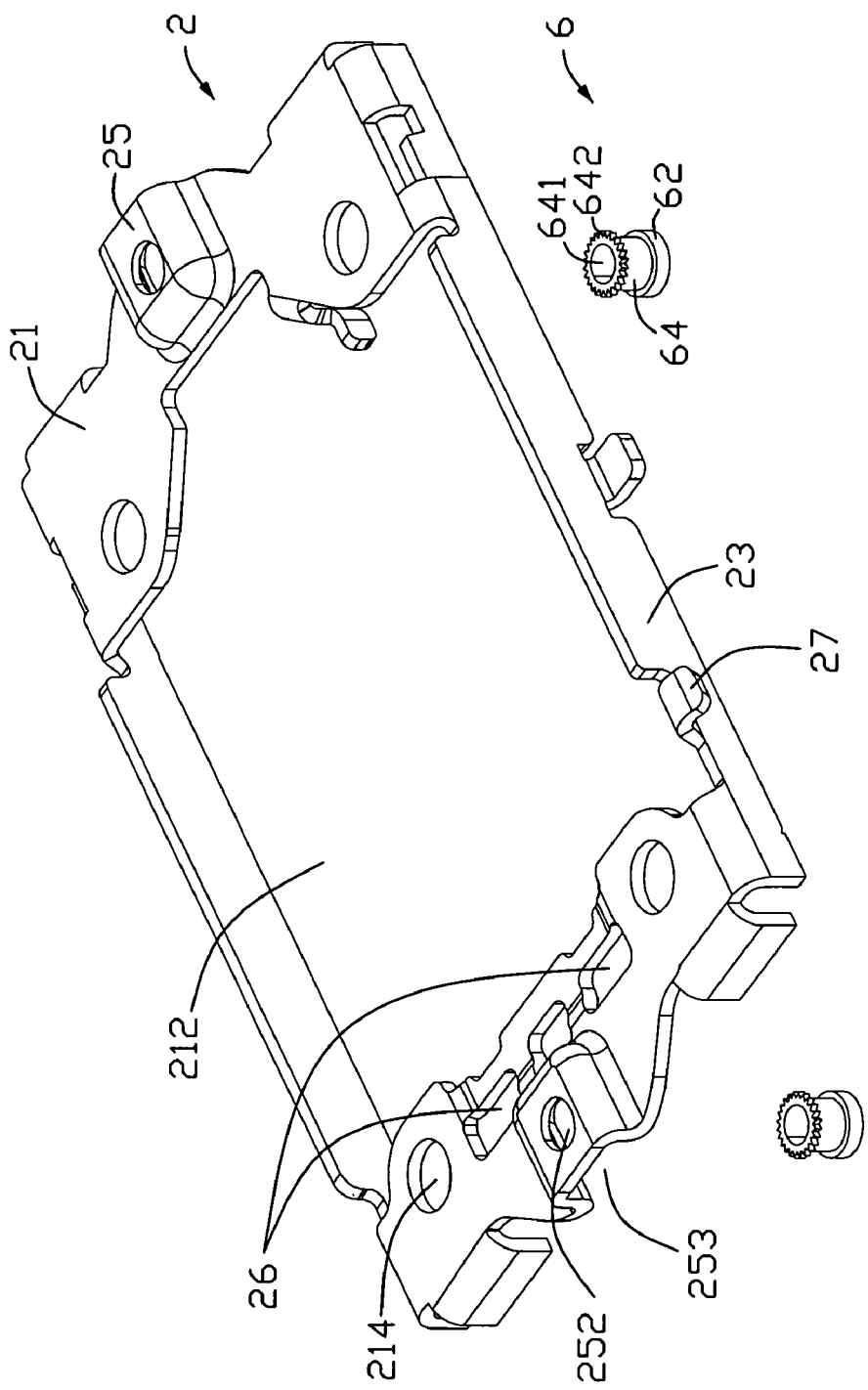
FIG. 2 is a perspective view of a stiffener as shown in FIG. 1.

Referring to the FIG. 2, the connecting portion 6 includes a base 62, a body portion 64 having a number of protrusions 642 projecting outwardly therefrom and a screw hole 641 defined therein for engaging with the heat sink.

Figure 3:
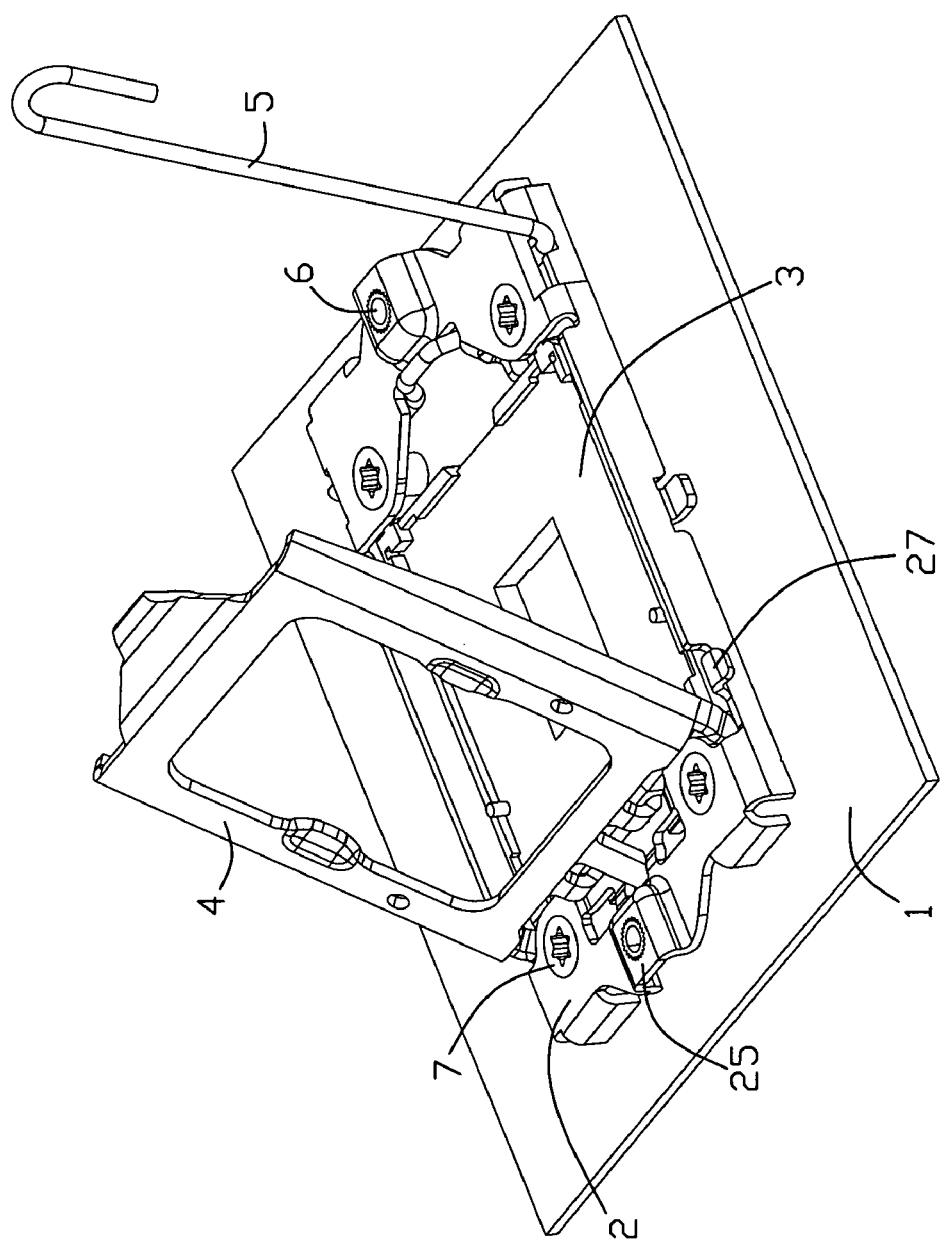
FIG. 3 is an assembly view of the electrical connector assembly as shown in FIG. 1.

Referring to FIGS. 1-3, The stiffener 2 is punched by a metal sheet and comprises a top plate 21 defining a pair of recesses 26, a window 212 defined in a middle portion of the top plate 21 for receiving the housing 3 and a pair of side walls 23 extending downwardly from the top plate 21. The stiffener 2 comprises a pair of opposite protruding portions 25 each bent upwardly to define a hollow 253 below the protruding portion 25 and a pair of mounting holes 252 respectively defined on the protruding portion 25 for engaging with the connecting portion 6. The stiffener 2 further has a latch 27 extending outside from the side wall 23 for engaging with the lever 5, a number of first holes 214 defined on the top plate 21.

The clip 4 has four side plates 41 and a central aperture 43, and a projecting portion 42 extending from the side plate 41. The clip 4 further has a pair of hooks 44 pivotably engaging with the recesses 26 of the stiffener 2. The lever 5 comprises a mating portion 51 rotatably locating on the projecting portion 42 and an operating portion 52 extending perpendicularly from the mating portion 51 and locked by the latch 27 of the stiffener 2.

In assembly, firstly, the housing 3 is soldered onto the printed circuit board 1. Secondly, the connecting portions 6 are firmly received in the mounting hole 252 by the interference between the protrusions 642 and the inner surface thereof. A plurality of screws 7 are provided for inserting through the first holes 214 and engaging with the printed circuit board 1 for mounting the stiffener 2 to the printed circuit board 1. Thirdly, the hooks 44 of the clip 4 are pivotably mating with the recesses 26 of the stiffener 2 and the lever 5 is provided for engaging with the projecting portion 42 of the clip 4 and the latch 27 of the stiffener 2. Finally, the heat sink is assembled to the stiffener 2 by the engagement between the screw holes 641 of the connecting portions 6 and a number of posts disposed on, or extending through, the heat sink.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly for connecting a heat sink thereto and for mounting to a printed circuit board, comprising:
   a housing assembled to the printed circuit board;
   a plurality of contacts mounted into the housing;
   a stamped stiffener comprising a top plate defining a plurality of mounting holes and a window defined in a centre of the top plate aligned with the housing;
   a plurality of connecting portions interfering with the inner surface of the mounting hole for connecting the heat sink to the stiffener;
   a clip covering the housing and pivotably engaging with one side of the top plate of the stiffener; and
   a lever coupling with the stiffener for pressing the clip.

2. The electrical connector assembly as claimed in claim 1, wherein said connecting portion comprises a base and a body portion having a plurality of protrusions projecting outwardly.

3. The electrical connector assembly as claimed in claim 2, wherein said connecting portion defines a hole through the base and the body for engaging with the heat sink.

4. The electrical connector assembly as claimed in claim 1, wherein said top plate has a pair of opposite protruding portions each bulging upwardly, and said mounting hole is defined on the protruding portion.

5. The electrical connector assembly as claimed in claim 1, wherein said stiffener has a pair of opposite side walls extending downwardly from the top plate.

6. The electrical connector assembly as claimed in claim 5, wherein said clip has a projecting portion extending forwardly therefrom, the stiffener has a latch projecting outwardly from the side wall, and the lever comprises a mating portion rotatably located on the projecting portion and an operating portion extending perpendicularly from the mating portion for locking to the latch.

7. The electrical connector assembly as claimed in claim 1, further comprising a plurality of screws, and wherein said top plate of the stiffener has a plurality of holes securely receiving the screws.

8. The electrical connector assembly as claimed in claim 1, wherein said top plate comprises a plurality of recesses defined on a rear portion thereof, said clip having a plurality of hooks for engaging with the recesses.

9. The electrical connector assembly as claimed in claim 1, wherein said clip has four side plates and a central aperture.

10. An electrical connector assembly for connecting a heat sink thereto and for mounting to a printed circuit board, comprising:
    an insulative housing assembled to the printed circuit board;
    a plurality of contacts disposed into the housing;
    a metallic stiffener comprising a top plate defining a plurality of mounting holes and a window defined in a centre of the top plate aligned with the housing;
    a plurality of connecting portions interfering with the inner surface of the mounting hole for connecting the heat sink to the stiffener;
    a clip covering the housing and pivotably engaging with one side of the top plate of the stiffener; and
    a lever coupling with the stiffener for pressing the clip.

11. The assembly as claimed in claim 10, wherein an area surrounding the mounting hole is raised upward in comparison with the neighboring areas for providing a seat on which the heat sink is located.

12. The assembly as claimed in claim 11, wherein most portions of the lever is hidden under the stiffener.

* * * * *